United States Patent
Ted

(12) 
(10) Patent No.: US 6,501,665 B1
(45) Date of Patent: Dec. 31, 2002

(54) STRUCTURE OF A BALL GRID ARRAY IC MOUNTING SEAT

(75) Inventor: Ju Ted, Taipei (TW)

(73) Assignee: Lotes Co., Ltd., Keelung (TW)

(*) Notice: Subject to any disclaimer, the term of this patent is extended or adjusted under 35 U.S.C. 154(b) by 0 days.

(21) Appl. No.: 09/925,499

(22) Filed: Aug. 10, 2001

(51) Int. Cl.$^7$ .............................. H05K 7/10; H05K 7/12
(52) U.S. Cl. ....................... 361/808; 361/767; 361/785; 361/803; 361/764; 439/82; 439/83; 439/70; 439/63; 439/876; 174/257; 174/737; 174/777; 174/778
(58) Field of Search ................................. 361/767, 764, 361/785, 803, 808; 439/326–329, 82, 83, 70, 876, 63; 174/257, 737, 777, 778

(56) References Cited

U.S. PATENT DOCUMENTS 6,280,219 B1 * 8/2001 Sano et al. ................. 439/268
6,352,437 B1 * 3/2002 Tate ............................ 439/83

* cited by examiner

Primary Examiner—Jayprakash N. Gandhi
Assistant Examiner—Thanh Y. Tran
(74) Attorney, Agent, or Firm—Leong C. Lei

(57) ABSTRACT

An improved structure of a Ball Grid Array IC mounting seat is disclosed. The IC mounting sear is characterized in that the middle section of the elongated thin strap is provided with a notch such that when the thin strap is folded correspondingly, the folding is at the side wall of the notch and all regions of the side edge of the notch are curved to externally clip the clipping body of the ball edge of the solder ball and the solder ball is mounted to the bottom clipping body of the conductive plates, thereby the solder ball is secured. In application the pre-soldering of the solder ball onto the conductive clipping plate is avoided, and the production process is rapid.

6 Claims, 9 Drawing Sheets

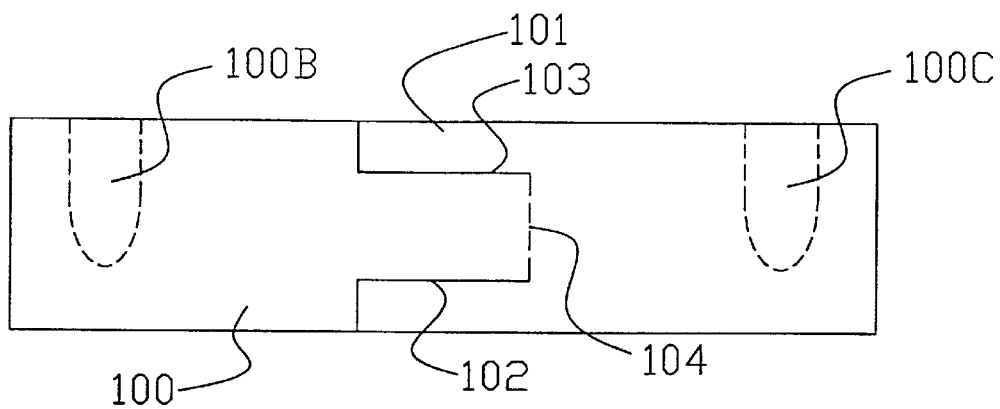
FIG. 4
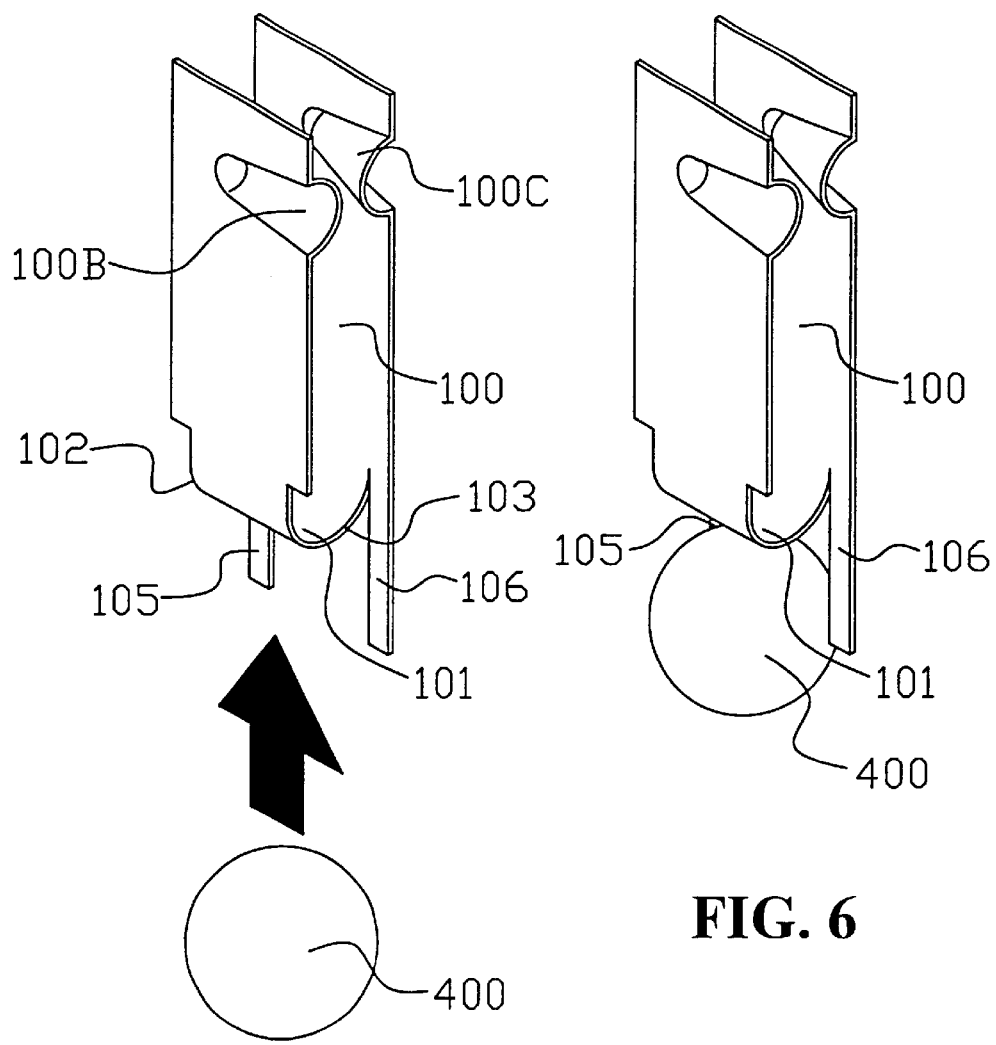
FIG. 6
FIG. 5

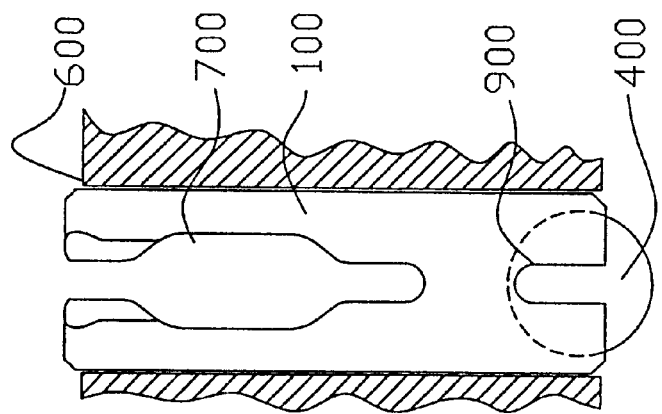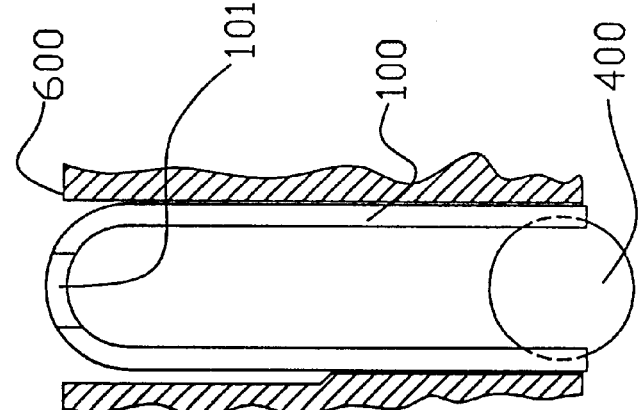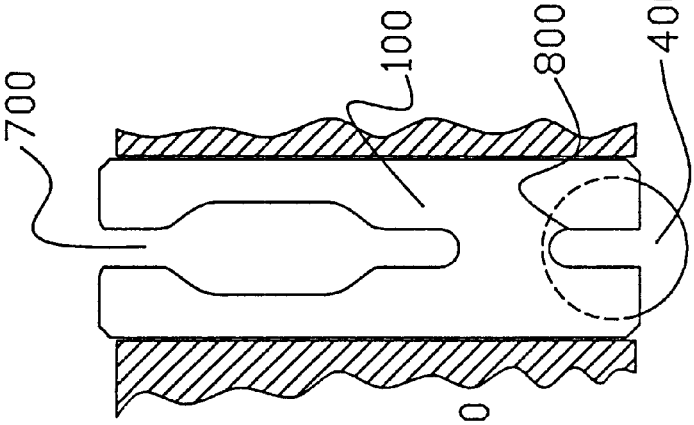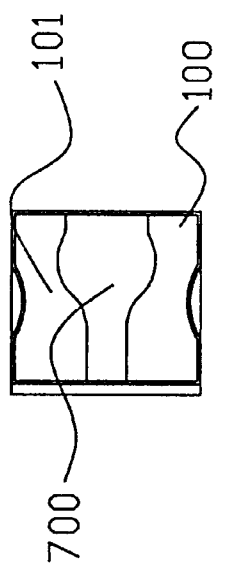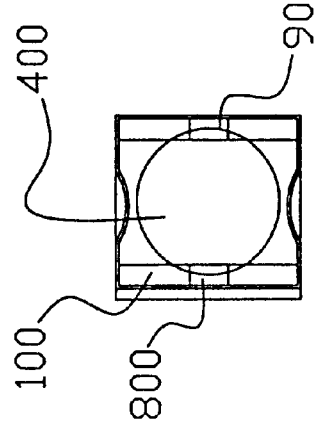
FIG. 17
FIG. 16
FIG. 19
FIG. 18
FIG. 20

STRUCTURE OF A BALL GRID ARRAY IC MOUNTING SEAT

BACKGROUND OF THE INVENTION

1. Field of the Invention

The present invention relates to an improved structure of a ball grid array IC mounting seat, and in particular, an IC mounting seat having a plurality of conductive clipping plates with clipping solder ball structure so as to eliminate the requirement of pre-soldering of solder ball onto the conductive clipping plates

2. Description of the Prior Art

Ball Grid Array IC mounting seat is a new mounting seat structure with solder balls to replace the mounting seat bottom of the insertion pins, and surface mounting technology is employed to mount the corresponding soldering position of the solder balls over the surface of the circuit board. FIG. 1 is a perspective view of Ball Grid Array CPU mounting seat. FIG. 2 is a bottom view of FIG. 1. The number of mounting pins of the corresponding IC pins is changed to semi-engaging seat bottom of the solder balls 11, 12, 13, such that the bottom surface of the CPU mounting seat is protruded from the hemisphere of the plurality of solder balls 11, 12, 13.

FIG. 3 is a combination view of the BGA CPU mounting seat of a conventional solder ball structure. Within the mounting seat 10, corresponding to IC pins, a plurality of straight slots 20, 21, 22 are formed. Each straight slot 20, 21, 22 is squeezed with a bending, U-shaped conductive clipping plate 30 of the elastic thin strap. The bottom end of the conductive clipping plate 30 does not protrude from the bottom of the seat 10, and, from the bottom section of the folded arch, a solder ball 40 is mounted such that the upper hemisphere of the solder ball 40 is engaged at the straight slot 20 and is mounted to the conductive clipping plate 30, and the lower hemisphere of the solder ball 40 is used for future mounting of a circuit board 50 to the soldering point. At an appropriate position on the two side walls of the conductive clipping plate 30, at least a pair of circular arch walls 31, 32 is provided for clipping with the IC pins 61, 62 of a top transverse board 60 mounted onto the seat 10. This conductive plate 30 together with the ball solder 40 has the following drawbacks:

a. Soldering process is required to pre-mount the solder ball 40 onto a conductive clipping plate.

b. More than one procedures of soldering of solder ball 40 are required.

Accordingly, it is an object of the present invention to provide an improved structure of a ball grid array IC mounting seat which mitigates the above drawbacks.

SUMMARY OF THE INVENTION

Accordingly, it is an object of the present invention to provide an improved structure of a ball grid array IC mounting seat, wherein an IC mounting seat for Ball Grid Array (BGA) has a plurality of conductive clipping plates corresponding to a plurality rows of IC pins to match with a plurality of solder balls, the conductive clipping plate is an elastic elongated thin strap and has a middle section being bent to form two parallel side walls for clipping the physical body of the IC pins.

Yet another object of the present invention is to provide an improved structure of a ball grid array IC mounting seat, wherein the pre-soldering of the solder ball onto the conductive clipping plate is avoided, and the production process is rapid.

A further object of the present invention is to provide an improved structure of a ball grid array IC mounting seat, wherein the number of time of soldering procedures is reduced and the contamination of the solder balls is minimized, and the quality of soldering is stable.

These and other advantages of the present invention will become clear to those skilled in the art upon a study of the detailed description of the invention and of the several figures of the drawings.

BRIEF DESCRIPTION OF THE DRAWINGS

FIG. 4 is an extended plan view of the conductive clipping plate of the Ball Grid Array of the present invention.

FIG. 5 shows the action of the solder ball clipping by the clipping plate of the Ball Grid Array of the present invention.

FIG. 6 is a perspective view showing the solder ball clipping by the clipping plate of the Ball Grid Array of the present invention.

FIG. 16 is a front view of the clipping ball of FIG. 15 in accordance with the present invention.

FIG. 17 is aright side of the clipping ball of FIG. 16 of the present invention.

FIG. 18 is a left side of the clipping ball of FIG. 16.

FIG. 19 is a top view of the clipping ball of FIG. 16.

FIG. 20 is a bottom view of the clipping ball of FIG. 15.

DETAILED DESCRIPTION OF THE PRESENT INVENTION

Figure 1:
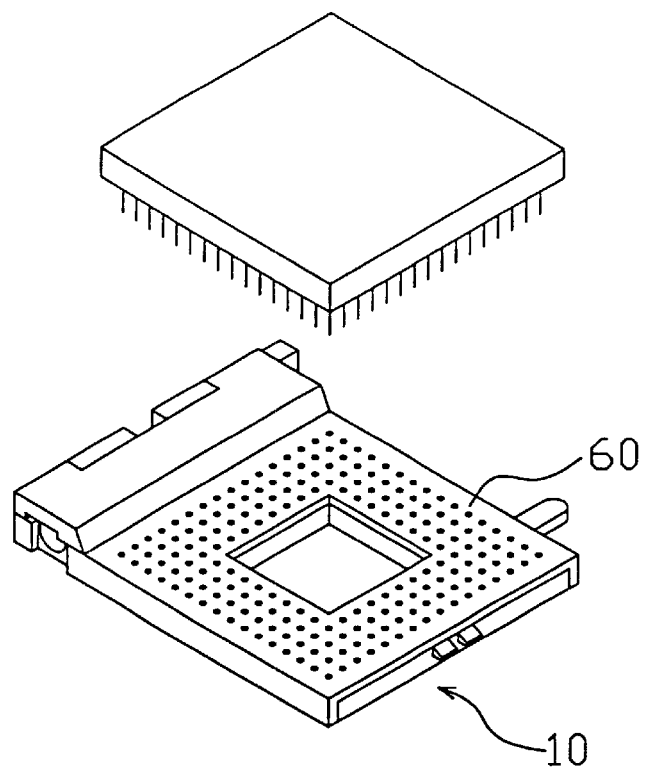
FIG. 1 is a perspective view of a conventional Ball Grid Array CPU mounting seat.
Figure 2:
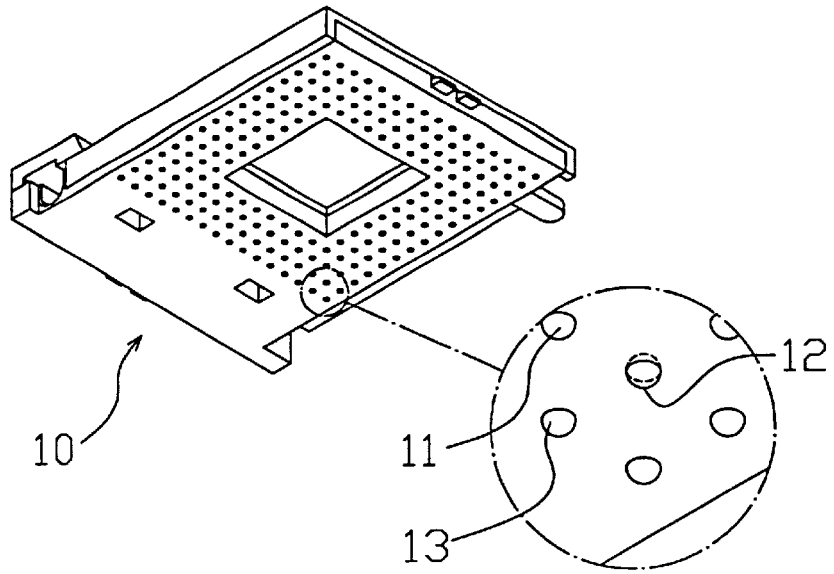
FIG. 2 is a bottom view of FIG. 1.
Figure 3:
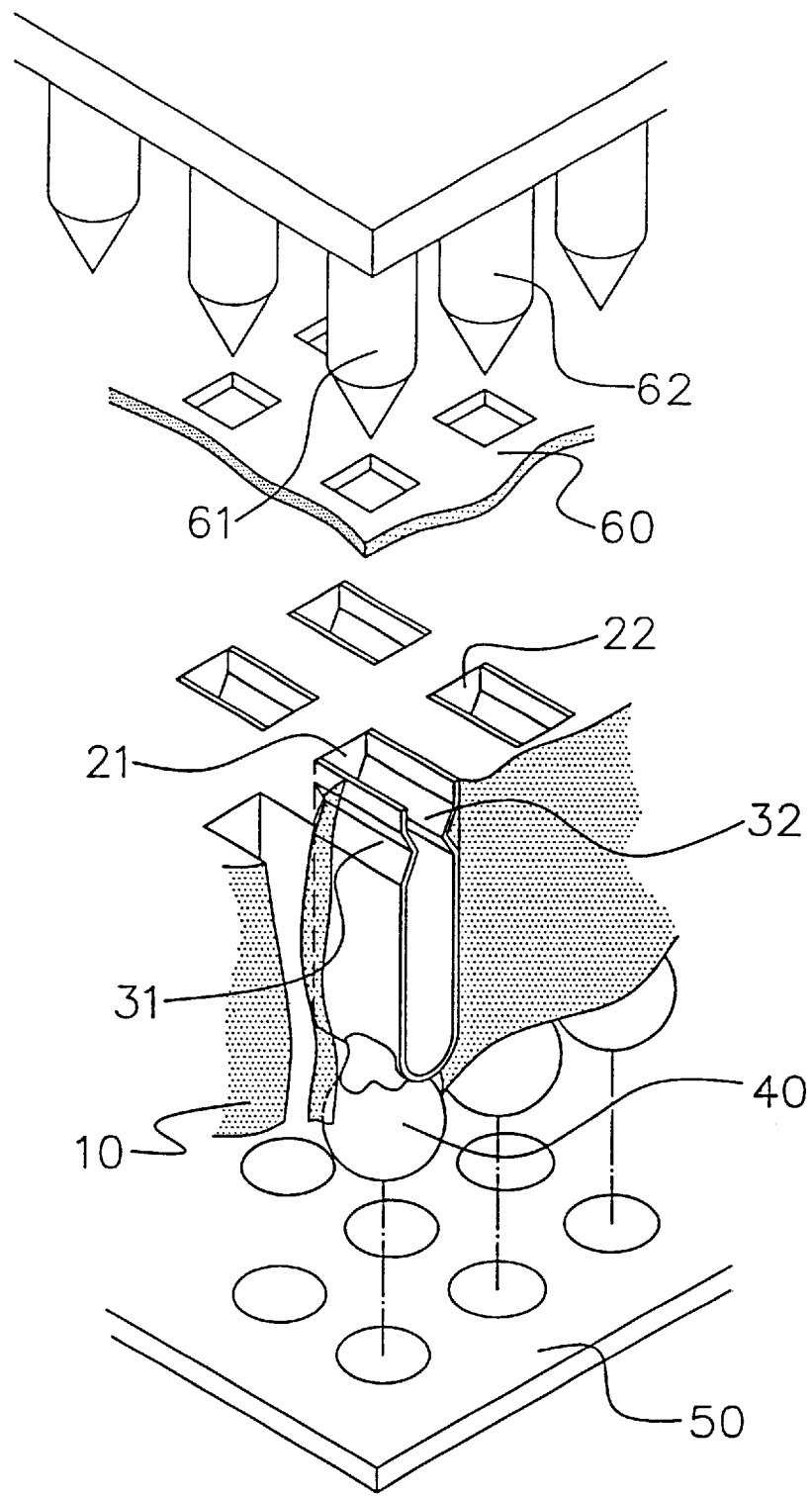
FIG. 3 is a combination view of the BGA CPU mounting seat of a conventional solder ball structure.

FIG. 4 is an extended plan view of the conductive clipping plate of the Ball Grid Array of the present invention. As shown in the figure, an appropriate position of the sidewall at the two ends of an elongated conductive strap 100 are disposed with at least a pair of fastening arch-shaped walls 100B, 100C to clip the IC pins, and the conductive strap 100 can be folded, and the middle section arch-shaped region 101 of a conductive clipping plate 100A is formed into a notch of an appropriate shape, and the notch is extended without discontinuation. The notch is shown in the figure. At the middle section of the two sides of the strap 100 along the axial direction, corresponding L-shaped slits 102, 103 are formed, and a folding line 104 is formed between the slits 102, 103. When the arch at the middle region of the strap 100 is folded into two, the fold is at the side edge wall of the notch (being the edge of the slits 102, 103) such that all regions of the side edge of the notch are bent to externally clip the clipping bodies 105, 106 at the ball edge of the solder ball 400, as shown in FIG. 5.

As shown in FIG. 6, the solder ball 400 is mounted between the bottom clipping bodies 105, 105 of the conductive clipping plate 100A and is secured.

Figure 7:
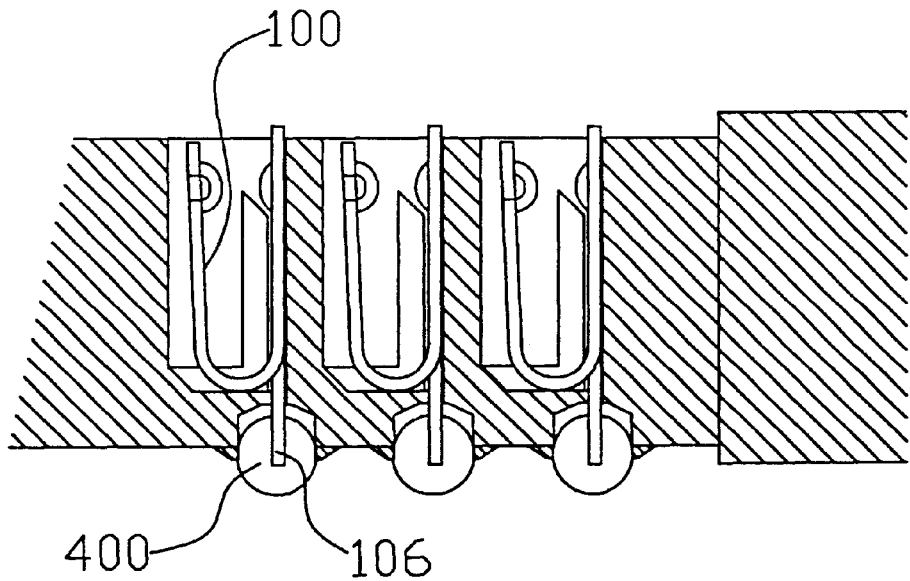
FIGS. 7 to 8 are sectional views of the solder ball clipping by the clipping plate of the Ball Grid Array of the present invention.
Figure 8:
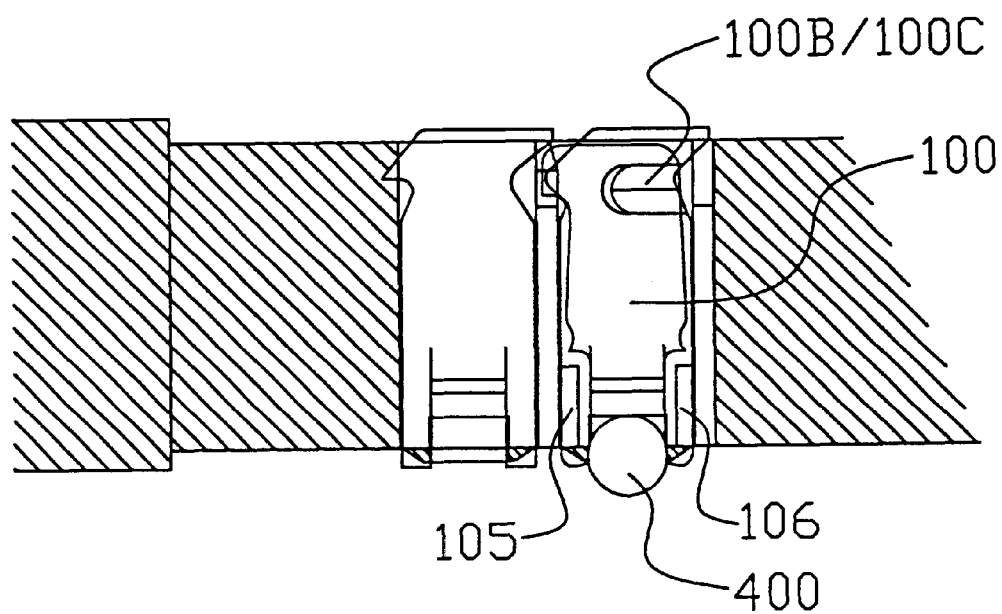
Figure 9:
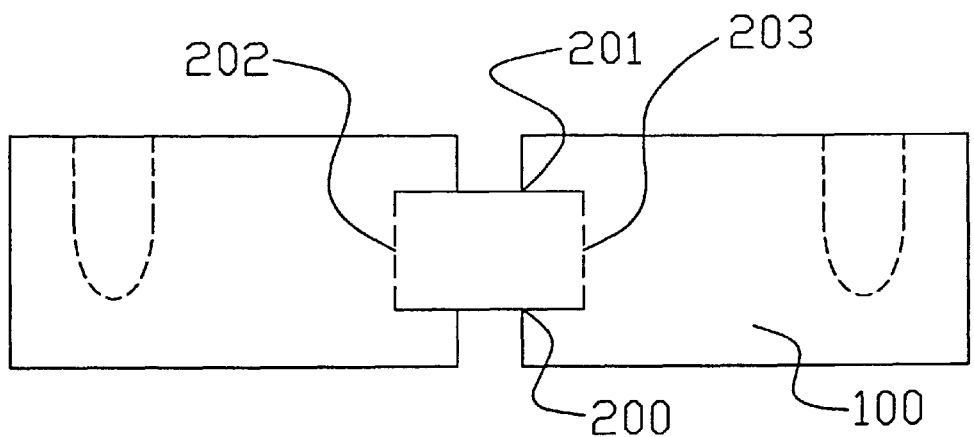
FIG. 9 is an extended plan view of another preferred embodiment of the conductive clipping plate of the Ball Grid Array of the present invention.
Figure 10:
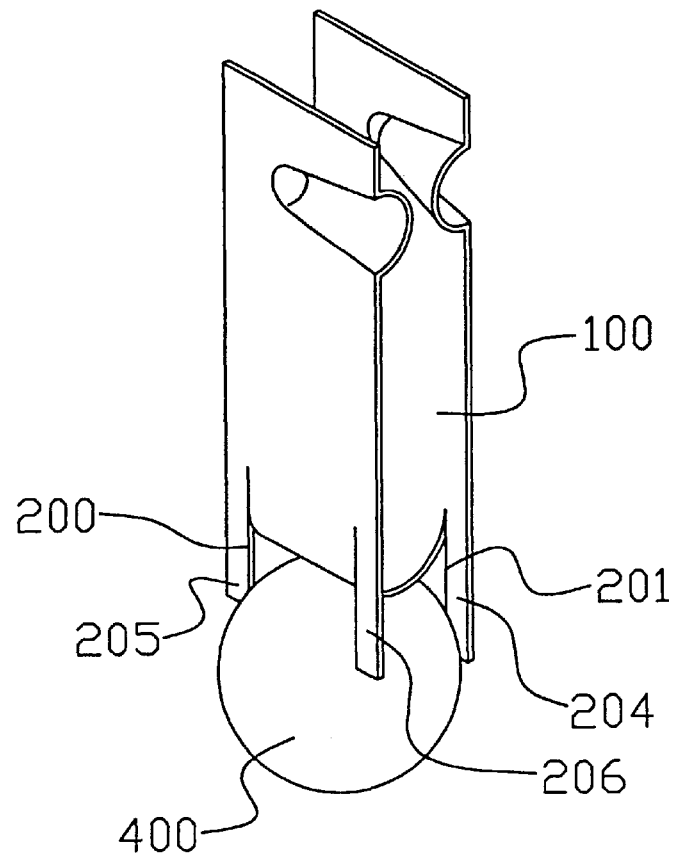
FIG. 10 is a perspective view of the clipping solder ball of FIG. 9 in accordance with the present invention.
Figure 11:
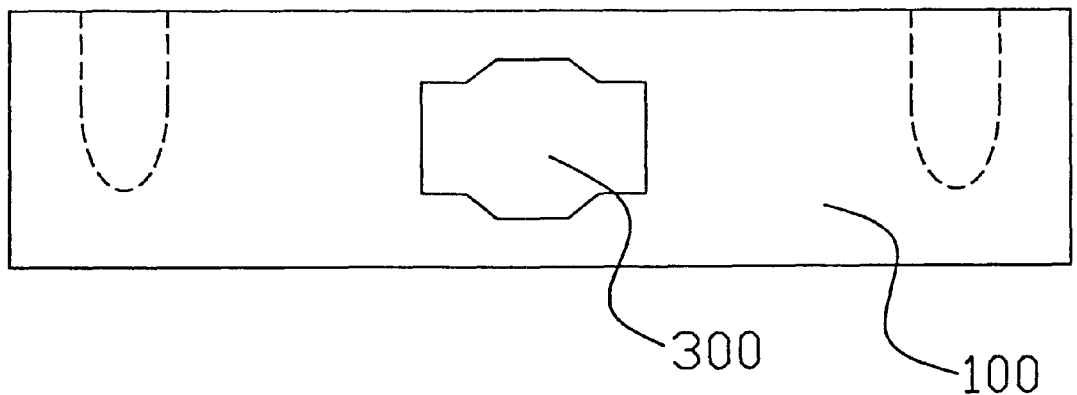
FIG. 11 is an extended plan view of another preferred embodiment of the conductive clipping plate of the Ball Grid Array of the present invention.
Figure 12:
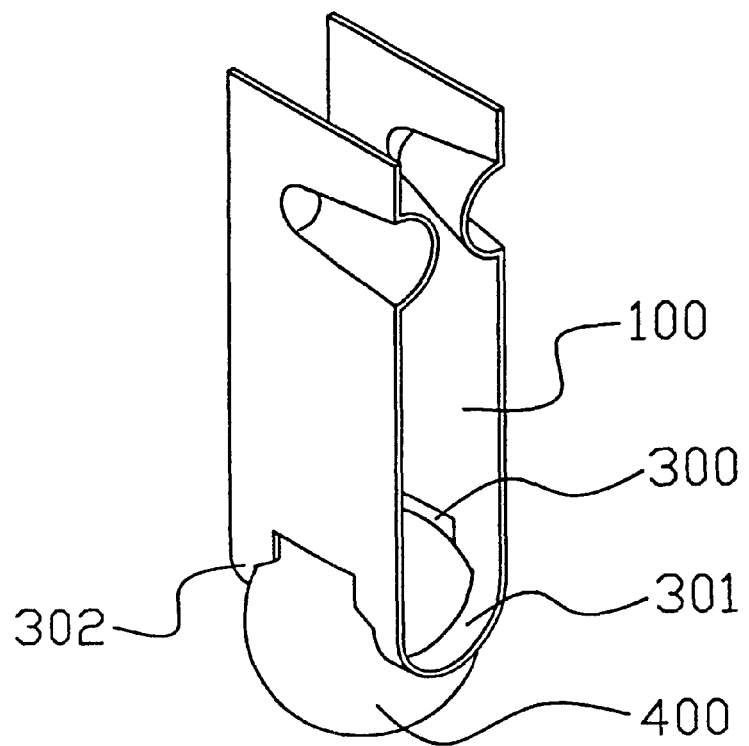
FIG. 12 is a perspective view of the clipping solder ball of FIG. 10 in accordance with the present invention.

FIGS. 7 and 8 are sectional views showing the mounting of the IC mounting seat. The clipping bodies 105, 106 provide stabilization for the solder ball 400. The solder ball 400 is mounted onto the circuit board and is corresponding to the soldering position to hold the solder ball 400 to securely mount to the edge wall of the notch. In application, the soldering is complete without affecting the electrical conductivity and the installation thereof The conductive clipping plate of the present invention is shown in FIG. 9. The notch is located at the middle section of the two lateral sides of the strap body 100 along the axial direction of the strap 100 and is, for example, a °-shaped notch 200, 201. Two folding lines 202, 203 are formed between the two notches 200, 201. When the arch at the middle section of the conductive strap 100 is folded, as shown in FIG. 10, the fold is at the side edge wall of the notch (being the slit edge of the °-shaped notches 200, 201 such that all regions of the notch side edge are bent to form clipping bodies 204, 205, 206 to externally clip the ball edge of the solder ball 400, thereby the clipping bodies 204, 205, 206 produce a secured holding of the ball edge of the solder ball 400. As shown in FIG. 11, the strap body 100 is provided with a notch at an appropriate position at the middle section of the strap 100 and is a tapered clipping through hole 300, as shown in FIG. 12.

Figure 13:
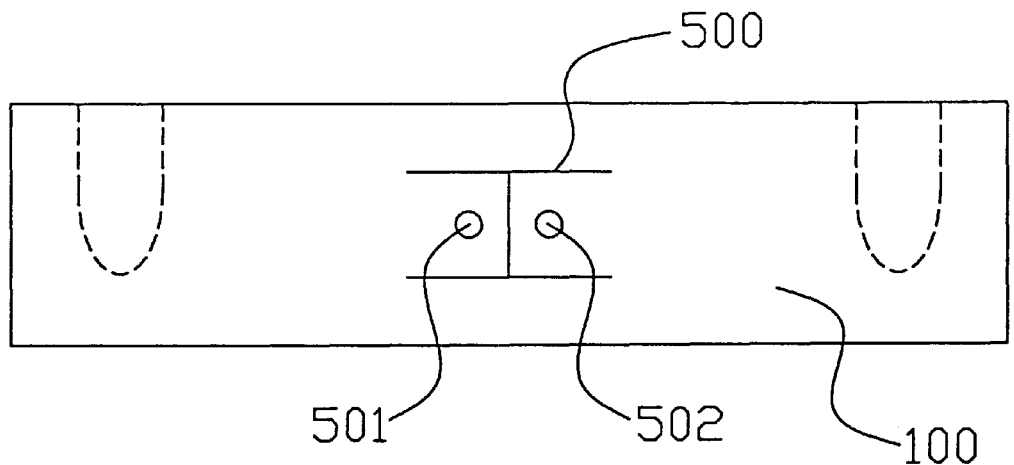
FIG. 13 is an extended plan view of another preferred embodiment of the conductive clipping plate of the Ball Grid Array of the present invention.
Figure 14:
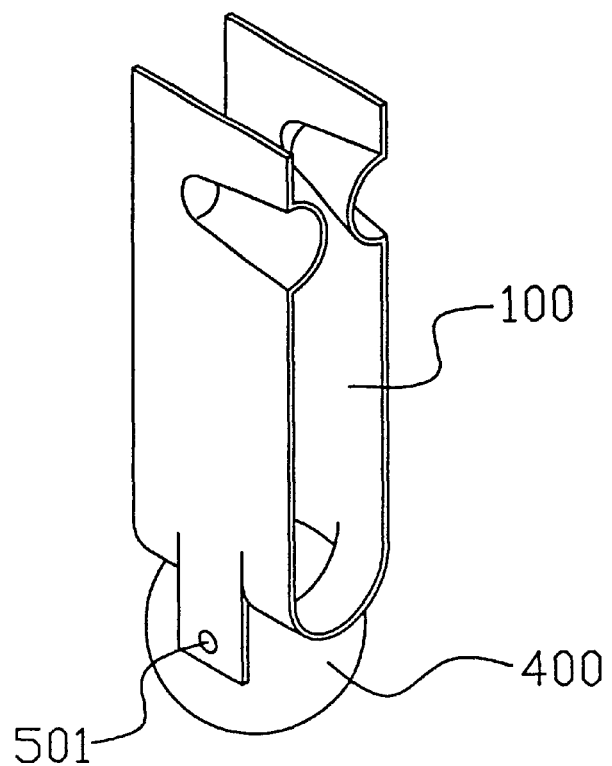
FIG. 14 is a perspective view of the clipping solder ball of FIG. 13 in accordance with the present invention.
Figure 15:
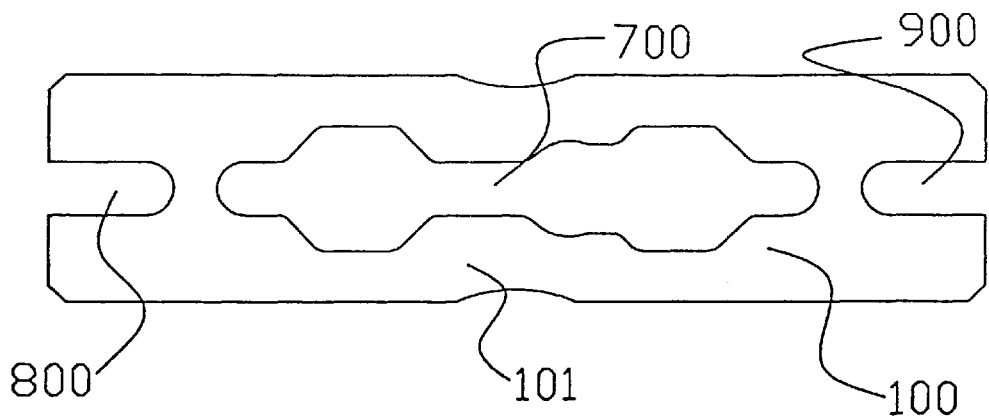
FIG. 15 is an extended plan view of another preferred embodiment of the conductive clipping plate of the Ball Grid Array of the present invention.

When the arch at the middle section of the conductive strap 100 is folded, the fold is at the notch side edge wall (i.e., the hole edge of the through hole 300) such that all regions of the notch side edge is folded to become clipping bodies 301, 302 to externally clip the ball edge of the solder ball 400 and thus the ball edge of the solder ball 400 is secured. As shown in FIG. 13, the notch on the strap body 100 is at the center of the middle section of the strap body 100, and along the axial direction of the strap body 100, a "I"-shaped slit 500 is formed. The slit 500 is extended continuously to the side edge of the strap body 100, and any three slit lines of the slit 500 formed as center is provided with a through hole 501, 502, as shown in FIG. 14. When the arch of the middle section of the elongated conductive thin strap 100 is folded, the fold is at the notch side edge wall (being the edge of the I-shaped slit 500) such that all regions of the notch side edge is bent to form the clipping bodies 503, 504 to externally clip the ball edge of the solder ball 400, and the through clipping hole 501 can engage at the extreme protrusion of the ball surface at the two sides of the solder ball 400. The secured clipping of the ball edge of the solder ball 400 is obtained.

In another preferred embodiment, an appropriate position at the side wall of the two sides of the elongated thin strap 100 does not provide with the arch wall 100B, 100C, and the method of clipping IC pins is changed, wherein the bending region 101 of the middle section is provided with an appropriate shape notch as shown in the figure. At the middle of the strap 100, a sliding slot 700 with a tapered shaped width is provided. The center of the two side ends of the strap 100 is transversely mounted with a clipping slot 800, 900.

Figure 21:
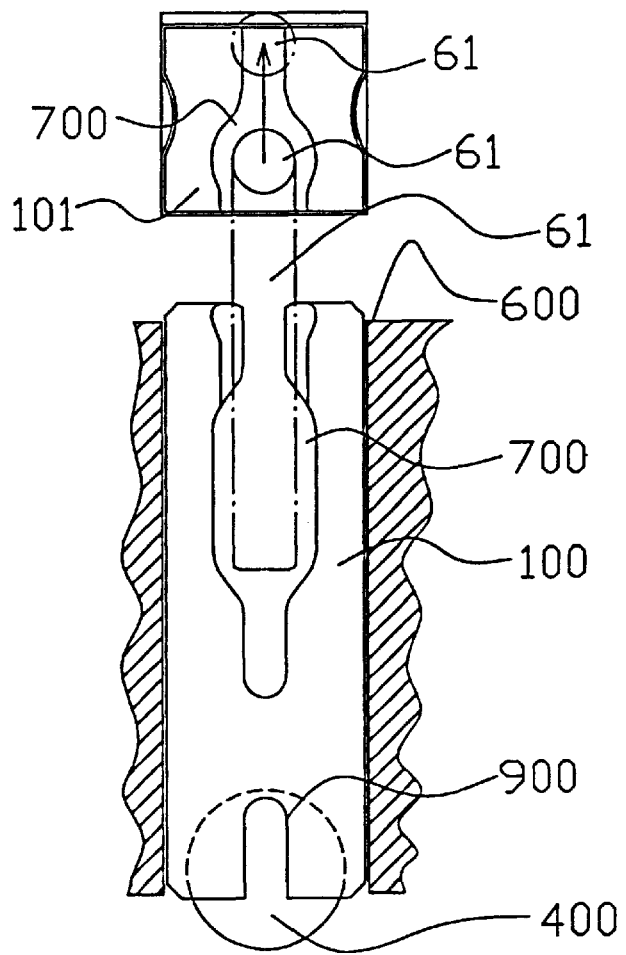
FIG. 21 is a top view of the mounted IC pin of FIG. 16.

As shown in FIGS. 16 to 20, when the arch at the middle section of the elongated thin strap 100 is folded, the strap 100 is squeezed into the IC mounting seat 600. The slot wall of the clipping slots 800, 900 at the two ends can tightly clip onto the ball center at the two ends of solder ball 400, as shown in FIG. 21, and various regions of the notch side edge wall being the slit edge of the sliding slot) are bent to form into a clipping opening for transversely sliding insertion of IC pins 61. Thus, the effectiveness of mounting IC pins 61 of clipping the solder ball is obtained.

While the invention has been described with respect to preferred embodiments, it will be clear to those skilled in the art that modifications and improvements may be made to the invention without departing from the spirit and scope of the invention. Therefore, the invention is not to be limited by the specific illustrative embodiment, but only by the scope of the appended claims.

I claim:

1. An IC mounting seat for Ball Grid Array (BGA) having a plurality of conductive clipping plates corresponding to rows of IC pins to match with solder balls, the conductive clipping plate being an elastic elongated thin strap and having a middle section being bent to form two parallel side wall for clipping the physical body of the IC pins, characterized in that the middle section of the elongated thin strap is provided with a notch such that when the thin strap is folded correspondingly, the folding is at the side wall of the notch and all regions of the side edge of the notch are curved to externally clip the clipping body of the ball edge of the solder ball and the solder ball is mounted to the bottom clipping body of the conductive plates, thereby the solder ball is secured.

2. The IC mounting seat of claim 1, wherein the notch is formed over the middle section of the two sides of the axial direction of the conductive thin strap and is a corresponding L-shaped slit, wherein a folding line is provided between the slits.

3. The IC mounting seat of claim 1, wherein the notch is formed over the middle section of the two sides of the axial direction of the conductive thin strap and is a corresponding °-shape notch, wherein two folding lines are provided between the °-shaped notch.

4. The IC mounting seat of claim 1, wherein the notch is a holding through hole of a specific tapered shaped formed at an appropriate position over the middle section of the conductive thin strap.

5. The IC mounting seat of claim 1, wherein the notch is an "I"-shaped slit formed over the center of the middle section of the conductive thin strap along the axial direction.

6. The IC mounting seat of claim 1, wherein a center enclosed by any of the three slits lines of the "I"-shaped slit is provided with a through clipping hole, thereby the folding of the conductive strap at the middle section causes the through clipping hole to hold the extreme protrusion at the ball surface of the two sides of the solder ball.

* * * * *